(12) United States Patent
Stroud et al.

(10) Patent No.: US 7,526,707 B2
(45) Date of Patent: Apr. 28, 2009

(54) METHOD AND APPARATUS FOR ENCODING AND DECODING DATA USING A PSEUDO-RANDOM INTERLEAVER

(75) Inventors: Peter Stroud, Longmont, CO (US);
Jonathan Ashley, Los Gatos, CA (US);
Hongwei Song, Longmont, CO (US);
Zachary Keirn, Loveland, CO (US)

(73) Assignee: Agere Systems Inc., Allentown, PA (US)

( * ) Notice: Subject to any disclaimer, the term of this patent is extended or adjusted under 35 U.S.C. 154(b) by 361 days.

(21) Appl. No.: 11/047,914

(22) Filed: Feb. 1, 2005

(65) Prior Publication Data

US 2006/0174184 A1    Aug. 3, 2006

(51) Int. Cl.
*G06F 11/00*    (2006.01)
(52) U.S. Cl. .................... 714/750; 348/614; 380/214
(58) Field of Classification Search .................. 714/728
See application file for complete search history.

(56) References Cited

U.S. PATENT DOCUMENTS

| | | | | |
|---|---|---|---|---|
| 3,818,442 A * | 6/1974 | Solomon | ................... | 714/781 |
| 6,161,209 A * | 12/2000 | Moher | ................... | 714/780 |
| 6,718,503 B1 * | 4/2004 | Lerner et al. | ................. | 714/755 |
| 6,763,363 B1 * | 7/2004 | Driscoll | ................... | 708/252 |
| 7,111,221 B2 * | 9/2006 | Birru et al. | ................... | 714/755 |
| 2004/0091055 A1 * | 5/2004 | Williams | ................... | 375/259 |
| 2007/0140384 A1 * | 6/2007 | Choi et al. | ................... | 375/341 |

* cited by examiner

*Primary Examiner*—Esaw T Abraham
*Assistant Examiner*—Enam Ahmed
(74) *Attorney, Agent, or Firm*—Daniel J. Santos; John M. Harman

(57) ABSTRACT

A pseudo-random bit interleaver and de-interleaver comprising a source for generating pseudo-random numbers and transformation logic that transforms each pseudo-random number generated by the source into a plurality of different pseudo-random numbers. Each of the transformed pseudo-random numbers identifying a parity equation to which an incoming bit will be assigned for computing parity.

31 Claims, 4 Drawing Sheets

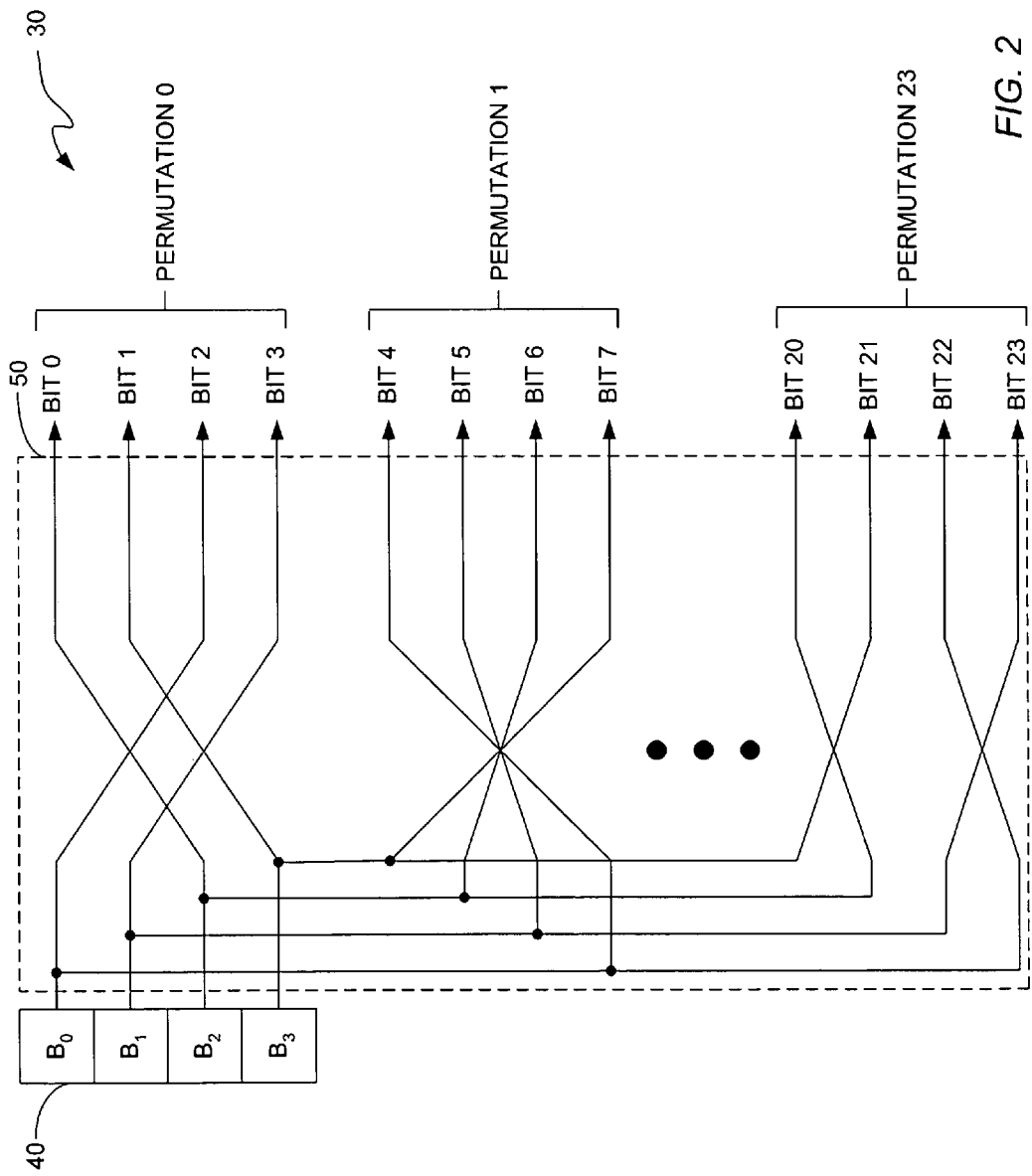

METHOD AND APPARATUS FOR ENCODING AND DECODING DATA USING A PSEUDO-RANDOM INTERLEAVER

TECHNICAL FIELD OF THE INVENTION

The invention relates to encoding and decoding digital information. More particularly, the invention relates to encoding and decoding digital information using a pseudo-random interleaver to pseudo-randomly generate, insert, and interpret parity its during the encoding and decoding processes.

BACKGROUND OF THE INVENTION

Digital communications systems and digital storage systems are similar from the perspective of extracting the original (transmitted or stored) bits from the received signal or from the readback signal. In the case of communications channels, the digital information is transferred from one location to another location, but at the same time (perhaps with a small transmission delay), whereas in storage channels, the information is transferred from one time to a later time, but at the same location (e.g., on a magnetic disk). The goal in both cases is to retrieve the original bits as accurately as possible in the presence of impairments such as noise and inter-symbol interference (ISI).

One method for improving the accuracy of the retrieved digital information involves using error correcting codes (ECCs). ECCs typically use parity bits to introduce redundancy into the signal to encode it prior to transmission or storage. Such redundancy is subsequently used to decode the encoded information and correct bit errors. The ability to correct bit errors is known as error recovery performance.

A variety of different systems and techniques are known that rely on redundancy to encode and decode digital information. Some systems use an interleaver to generate and insert parity bits at various locations in the data stream. These systems are typically highly structured in the sense that they systematically generate and insert parity bits at various locations in the data stream in order to ensure that an error event will affect multiple parity equations. Increasing the number of parity equations that are affected by an error event increases the effectiveness of using redundancy. Such systems are usually relatively easy to implement in an integrated circuit (IC) and require a relatively small amount of area on the IC in which they are manufactured. One disadvantage of this type of system is that the highly structured manner in which bits are interleaved makes it very likely that a degenerate type of error event will occur that will exploit the structure of the system, thereby preventing the full potential of using redundancy from being realized.

Some encoders and decoders do not use an interleaver. In systems that do not use an interleaver, certain types of error events will always exploit the structure of the underlying parity equations. Such systems generally have relatively poor error recovery performance.

It is known that randomizing the underlying parity relationships (or equations) increases the number of parity equations that are affected by certain error events. Therefore, an interleaver that uses randomly defined parity relationships fully exploits redundancy and thus can provide very good error recovery performance. However, it is very difficult to achieve true randomness in manmade systems.

A need exists for a method and an apparatus for encoding and decoding digital information that more fully exploit the use of parity bit redundancy and which can be implemented relatively easily in an IC.

SUMMARY OF THE INVENTION

The invention provides a pseudo-random bit interleaver or de-interleaver and a method for interleaving or de-interleaving parity bits. The interleaver or de-interleaver comprises a source that generates pseudo-random numbers and transformation logic that transforms each of the pseudo-random numbers generated by the source into a plurality of different pseudo-random numbers. Each of the transformed pseudo-random numbers identifies a parity equation to which a respective one of the incoming bits will be assigned. The method of the invention comprises generating pseudo-random numbers with a pseudo-random number generation source and transforming each pseudo-random number generated by the source into a plurality of different pseudo-random numbers, each of which identifies a parity equation to which an incoming bit will be assigned.

These and other features of the invention will become apparent from the following description, drawings and claims.

BRIEF DESCRIPTION OF THE DRAWINGS

FIG. 2 is a block diagram of the pseudo-random bit interleaver of the invention in accordance with a first exemplary embodiment.

DETAILED DESCRIPTION OF THE PREFERRED EMBODIMENT

Figure 1:
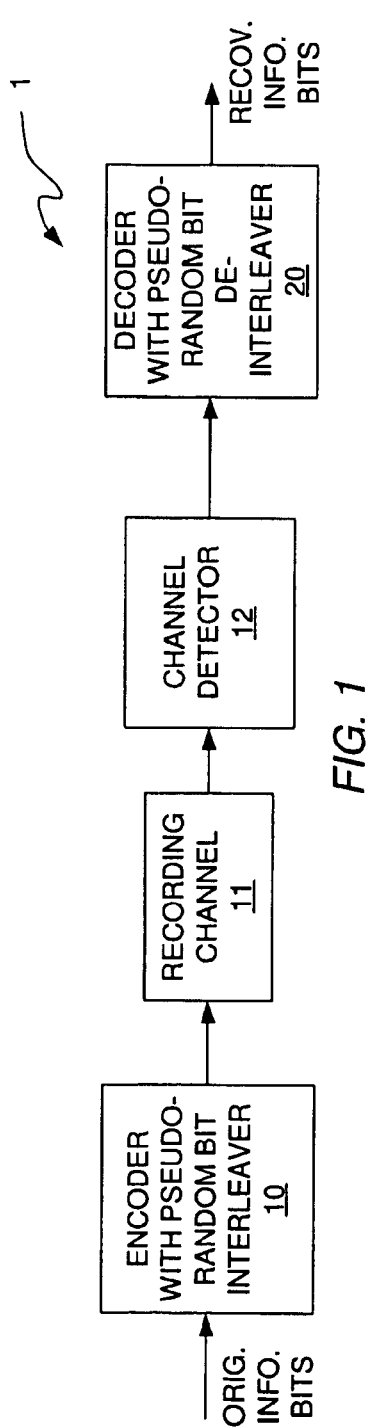
FIG. 1 illustrates a block diagram of a digital recording system that employs the pseudo-random bit interleaver of the invention.

In accordance with the invention, a source for generating pseudo-random bit sequences is used in conjunction with transformation logic that transforms the pseudo-random bit sequences generated by the source into a plurality of different pseudo-random bit sequences. The resulting transformed pseudo-random bit sequence corresponds to a number having a value between 0 and $2^N-1$, where N is the number of bits in the sequence. Each pseudo-random number produced by the transformation logic identifies the parity equation to which an incoming bit will be assigned.

In the encoder, the incoming bits are the information bits that have not yet been encoded with parity. As respective information bits are received in the encoder, the encoder assigns the bits to respective parity equation numbers, which correspond to the pseudo-random numbers produced by the transformation logic. The encoder then calculates the parity bits by computing the parity equations and interleaves the parity bits with the information bits.

In the decoder, the incoming bits are the encoded information bits, i.e., the information bits and the parity bits. As the respective encoded bits are received in the decoder, the decoder assigns the received bits to respective parity equations in accordance with the pseudo-random numbers generated by the transformation logic of the decoder. Each pseudo-random number generated by the transformation logic identifies a parity equation number to which a corresponding bit will be assigned. After the bits have been assigned, the decoder performs the operations defined by the parity equations to calculate parity, which the decoder uses to detect errors.

A parity equation typically corresponds to all of the bits in a given equation being exclusively ORed (XORed) together, although other equations are possible. For a parity equation to satisfy even parity, the result of the XOR operation is 0. For a parity equation to satisfy odd parity, the result of the XOR operation is 1. To calculate odd parity, the result of the XOR operation is inverted.

The manner in which the invention uses bits in a transformed pseudo-random bit sequence to assign bits to parity equations can be seen below in Table 1.

TABLE 1

| Row Number | Bit | Row Parity Equation Number |
|---|---|---|
| Row 0 | 0 | 0 |
| Row 1 | 1 | 3 |
| Row 2 | 0 | 5 |
| Row 3 | 0 | 2 |
| Row 4 | 0 | 7 |
| Row 5 | 1 | 1 |
| Row 6 | 0 | 4 |
| Row 7 | 1 | 6 |

For a single column of data having eight rows, the information shown in Table 1 indicates the following. The bit in row 0, which is a 0, will be assigned to parity equation number 0. The bit in row 1, which is a 1, will be used in parity equation number 3. The bit in row 2, which is a 0, will be used in parity equation number 5. The bit in row 3, which is a 0, will be used in parity equation number 2. The bit in row 4, which is a 0, will be used in parity equation number 7. The bit in row 5, which is a 1, will be used in parity equation number 1. The bit in row 6, which is a 0, will be used in parity equation number 4. The bit in row 7, which is a 1, will be used in parity equation number 6.

In accordance with a first exemplary embodiment, the transformation logic permutes, or reorders a bit sequence generated by the source into a plurality of different bit sequences, which correspond to the parity equation numbers. In accordance with a second exemplary embodiment, the transformation logic uses matrix multiplication to transform bit sequences generated by the source into different bit sequences, which correspond to the parity equation numbers.

Prior to describing exemplary embodiments of the interleaver of the invention, a system in which such an interleaver may be used will be described with reference to FIG. 1. FIG. 1 illustrates a block diagram of a digital storage system 1 in accordance with the invention that uses parity bits to encode and decode digital information. The digital storage system 1 includes an encoder 10 that encodes information bits by pseudo-randomly interleaving parity bits throughout the information bits. Two exemplary embodiments of the pseudo-random bit interleaver of the invention are described below in detail with reference to FIGS. 2 and 3.

With reference to FIG. 1, the encoder 10 is typically a turbo product code (TPC) encoder. The encoded bits are stored in the recording channel 11. The encoded information bits are subsequently read out of the recording channel 11. The recording channel 11 typically includes physical and electrical components (not shown), such as the read/write head, the read/write head armature, the recording media, the pre-amplifier, etc. As encoded information bits are read out of the recording channel 11, the bits are processed by a channel detector 12 that performs an algorithm to detect bits. The detector 12 is typically a hard Viterbi detector that produces hard decisions (i.e., a decision that a bit is either a 1 or a 0) or a soft-output Viterbi algorithm (SOVA) detector that produces hard decisions and reliability estimates (i.e., respective estimates as to the reliability of the respective hard decisions). The output of the channel detector 12 is received by a channel decoder 20, which deinterleaves the parity bits and decodes the bit sequence using the pseudo-random bit de-interleaver of the invention, as described below in detail with reference to FIGS. 2 and 3.

FIG. 2 illustrates a block diagram of the pseudo-random bit interleaver 30 of the invention in accordance with a first exemplary embodiment. The interleaver 30 includes a linear feedback shift register (LFSR) 40 that functions as a source for generating pseudo-random bit sequences. The LFSR 40 is well suited for generating pseudo-random bit sequences because it is configured to generate all possible sequences once before repeating any of the possible sequences, and the sequences do not occur in any particular order. For example, a four-bit LFSR generates all of the numbers between 0 and 15 once before repeating, and the numbers do not occur in sequential order. For ease of illustration, FIG. 2 depicts a 4-bit LFSR.

The interleaver 30 includes transformation logic 50 for permuting each pseudo-random bit sequence generated by the source 40 into a plurality of pseudo-random bit sequences. As stated above, each of the transformed bit sequences corresponds to a parity equation to which a bit will be assigned. For example, a transformed bit sequence of 00001000 corresponds to parity equation number 8.

For an N-bit LFSR, the permutation logic 50 may produce N! (i.e., N factorial) bit sequences. Thus, for a four-bit LFSR, the transformation logic 50 may permute each source sequence into 4!=4×3×2×1=24 sequences. This provides the interleaver 30 with 24 choices of pseudo-random numbers for each pseudo-random bit sequence generated by the source 40. Each incoming bit is assigned to the parity equation that has the number produced by the permutation logic 50.

For example, for the bit in the recording channel memory at column/row address 0,0, permutation 0 may be selected as identifying the row parity equation to which the bit at that address will be assigned. For the bit at address 1,1, permutation 1 may be selected as identifying the row parity equation to which the bit at that address will be assigned, and so on. Of course, the manner in which selections are made may be varied as desired. As will be described below with reference to FIG. 5, selection logic, such as a multiplexer (not shown) is used to select the permutations and transmit them to parity equation logic in the encoder and decoder that performs the mathematical operations (e.g., XORing) dictated by the parity equations.

Typically, the LFSR 40 will be at least a six-bit LFSR, which will generate 64 different sequences before repeating. Thus, the transformation logic 50 preferably will provide 6!=6×5×4×3×2×1=720 choices from which the interleaver 30 will select each set . of row parity equations.

The pseudo-random interleaver 30 in conjunction with the transformation logic 50 provides very good error recovery. The transformation logic 50 makes many pseudo-random sequences available for each pseudo-random sequence generated by the source 40. In addition, the transformation logic 50 can be implemented very efficiently as wiring in a relatively small area in the IC. LFSRs can also be implemented very efficiently in an IC. Consequently, the interleaver 30 can be implemented very efficiently in an IC.

Figure 3:
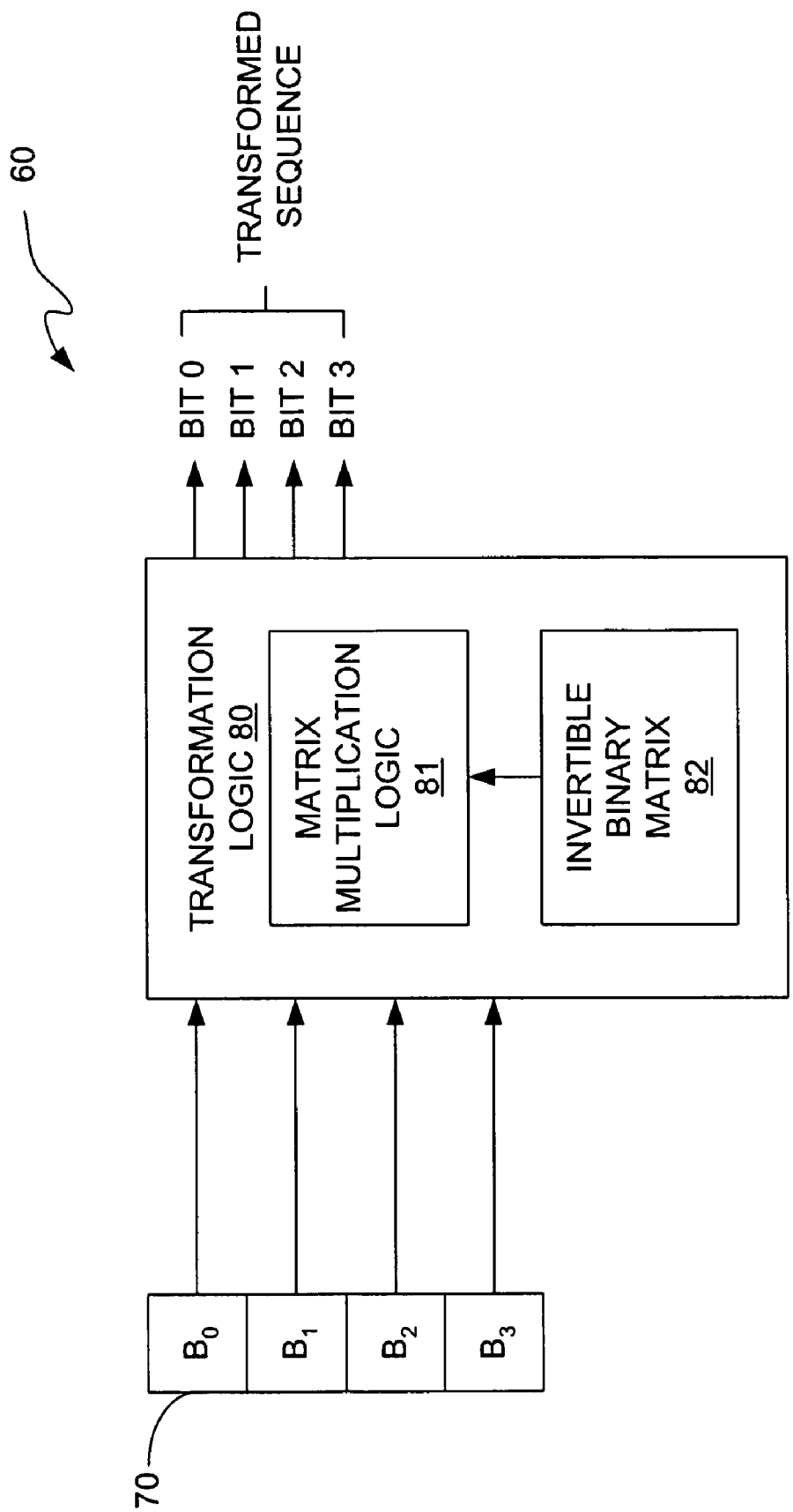
FIG. 3 is a block diagram of the pseudo-random bit interleaver of the invention in accordance with a second exemplary embodiment.

FIG. 3 illustrates a block diagram of another exemplary embodiment of the pseudo-random bit interleaver of the invention. In accordance with this embodiment, transformation logic is used to transform pseudo-random numbers generated by a source into a plurality of pseudo-random numbers. The pseudo-random interleaver 60 in accordance with this embodiment includes a LFSR 70 and transformation logic 80. The transformation logic 80 includes matrix multiplication logic 81 that multiplies each sequence generated by the source 70 by an invertible, or nonsingular, binary matrix 82.

A square matrix is nonsingular if its determinant is non-zero. For example, there are six nonsingular 2×2 binary matrices:

$$\begin{bmatrix} 0 & 1 \\ 1 & 0 \end{bmatrix}, \begin{bmatrix} 0 & 1 \\ 1 & 1 \end{bmatrix}, \begin{bmatrix} 1 & 0 \\ 0 & 1 \end{bmatrix}, \begin{bmatrix} 1 & 0 \\ 1 & 1 \end{bmatrix}, \begin{bmatrix} 1 & 1 \\ 0 & 1 \end{bmatrix}, \begin{bmatrix} 1 & 1 \\ 1 & 0 \end{bmatrix}.$$

For an N-bit LFSR, each source sequence will be multiplied by an N×N nonsingular matrix. For example, assuming for exemplary purposes that there are 32 rows and 16 columns in a codeword where data is transmitted in a columnwise manner (i.e., column-by-column), an N=5 bit LFSR is used. In this case, each bit sequence generated by the LFSR 70 will be multiplied by 16 different 5×5 matrices, i.e., one per column of the codeword. The number of transformations that are possible is: $(2^N-2^0) \times (2^N-2^1) \times (2^N-2^2) \times \ldots \times (2^N-2^{N-1})$. It should be noted that this is a much larger number than N!. Therefore, the number of resulting sequences achieved by the interleaver 60 in accordance with this embodiment can be much greater than the number of resulting sequences achieved by the interleaver 30 of the embodiment described above with reference to FIG. 2.

The matrix multiplication logic 80 only needs a single matrix multiplier per data path because the transformed sequences may be used serially. In other words, in a full-rate system in which one sample is operated on per clock cycle, a single data path is used. When a single data path is used, only a single matrix multiplier is needed. In a half-rate system in which two samples are operated on per clock cycle, two data paths and two corresponding matrix multipliers are used. In a quarter-rate system, four data paths and four matrix multipliers are used, and so on. The number of matrices that are multiplied by each sequence generated by the source is typically directly related to the definition of the two-dimensional (2-D) codeword: each column is intended to be a unique random sequence generated from the source sequence and thus should have a unique matrix associated with it. In general, one matrix per column preferably is used for a 2-D codeword.

Figure 4:
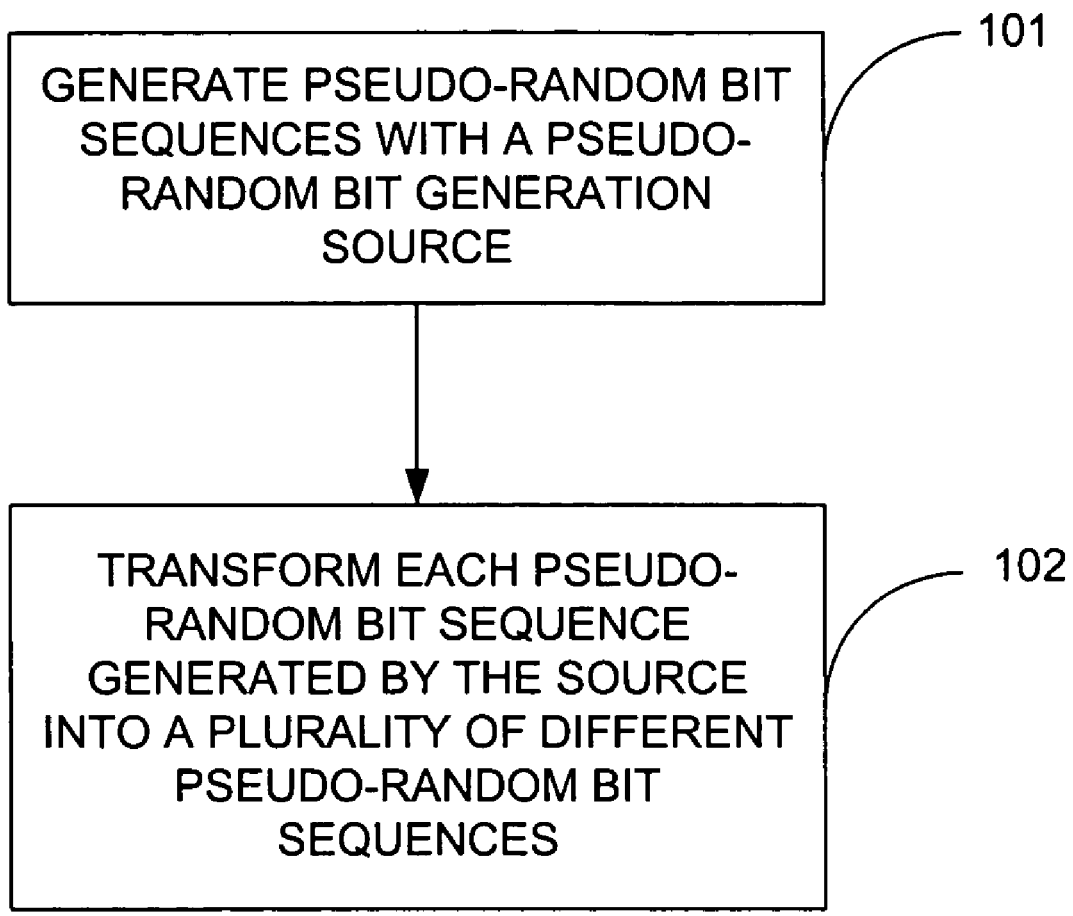
FIG. 4 illustrates a flow chart that represents the method of the invention in accordance with the preferred embodiment.

FIG. 4 illustrates a flow chart that represents the method of the invention in accordance with the preferred embodiment. The method comprises generating pseudo-random numbers with a pseudo-random number generation source, as indicated by block 101 and transforming each pseudo-random number generated by the source into a plurality of different pseudo-random numbers, as indicated by block 102.

Incoming bits (i.e., bits received in the encoder or decoder) are assigned by logic (not shown) in the encoder or decoder to the parity equation number equal to the transformed pseudo-random number. Assignment of the incoming bits to particular parity equation numbers typically corresponds to routing the incomings bit to corresponding XOR logic so that bits that are assigned to the same parity equation number are XORed together.

The transformations represented by block 102 may be performed by permuting the bit sequences produced by the source by reordering the source bit sequences (e.g., FIG. 2) or by transforming the bit sequences produced by the source through matrix multiplication (e.g., FIG. 3).

The configurations 30 and 60 shown in FIGS. 2 and 3 are also configured to function as de-interleavers. The de-interleaver of the invention is implemented in the decoder 20 shown in FIG. 1 and is configured and operates in the manner described above with reference to FIGS. 2, 3 and 4 to assign bits to parity equations. Because de-interleaving is essentially performed in the same manner as interleaving, the de-interleaver of the invention and the process performed by it will not be further described herein.

Figure 5:
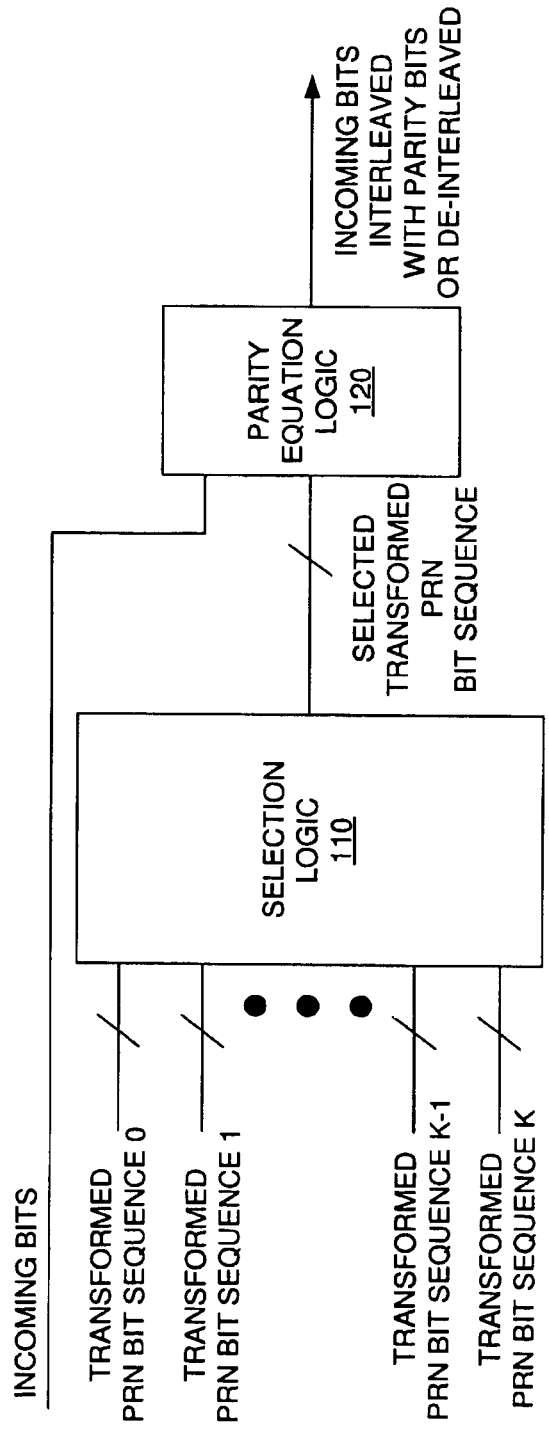
FIG. 5 illustrates a block diagram of selection logic and parity equation logic included in each of the pseudo-random bit interleaver of the de-interleaver of the encoder and decoder, respectively, shown in FIG. 1.

FIG. 5 illustrates a block diagram of selection logic 110 and parity equation logic 120 that are included in the interleaver and de-interleaver of the encoder 10 and decoder 20, respectively, shown in FIG. 1. The selection logic 110, may be, for example, a multiplexer (MUX). The selection logic 110 receives the transformed PRN bit sequences that are output from the transformation logic 50 (FIG. 2) or 80 (FIG. 3). For example, in the case where the selection logic 110 comprises a MUX that operates in the typical manner, i.e., the MUX receives a select signal having a particular state that causes the MUX to select one of the inputted transformed bit sequences to be output from the selection logic 110. The selected transformed PRN bit sequence output from the selection logic 100 is transmitted to the parity equation logic 120. The parity equation logic 120 receives the transformed PRN bit sequences as well as the incoming bits, which may be the information bits input to the encoder 10 (FIG. 1) or the bits output from the channel detector 12 (FIG. 1), depending on whether interleaver or de-interleaver operations are being performed.

Each transformed PRN bit sequence received by the parity equation logic 110 identifies a logical operator (e.g., an XOR gate) corresponding to a particular parity equation. Each incoming bit is routed to the identified logical operator, which then operates on the bit to perform the corresponding parity equation calculation. The results of the operations performed by the logical operators are then output from the parity equation logic 120. Thus, the output of the parity equation logic 120 is a combination of the incoming bits interleaved with or de-interleaved from the parity bits, depending on whether the parity equation logic 120 is part of the encoder 10 or part of the decoder 20, respectively.

It should be noted that the invention has been described with reference to particular exemplary and preferred embodiments and that the invention is not limited to the embodiments described herein. For example, FIGS. 2 and 3 illustrate particular configurations for transforming bit sequences. As will be understood by those skilled in the art, different configurations or modifications to the configurations shown in FIGS. 2 and 3 can be used to achieve the goals of the invention. For example, sources other than an LFSR can be used to generate pseudo-random bit sequences, including, for example, finite state machines based on read only memory (ROM). The invention is not limited to any particular type of source for generating the pseudo-random bit sequences. In addition, although the interleaver of the invention has been described in connection with its use in a digital recording system, it is also suitable for use in digital communications systems. Those skilled in the art will understand, in view of the description provided herein, the manner in which other modifications may be made to the embodiments described herein without deviating from the scope of the invention.

What is claimed is:

1. A pseudo-random bit interleaver that receives incoming bits and interleaves the incoming bits with parity bits, the interleaver comprising:
   a pseudo-random number (PRN) generation source for generating pseudo-random numbers (PRNs), each PRN comprising a sequence of bits;
   Transformation circuitry configured to transform each PRN generated by the PRN generation source into a plurality of different PRNs, each of said plurality of different PRNs comprising a respective transformed PRN sequence of bits, wherein each respective transformed PRN bit sequence identifies a respective parity equation to which a respective one of the incoming bits is assigned;
   selection circuitry configured to select respective ones of the transformed sequences of bits and to cause each respective incoming bit to be assigned to the respective parity equation identified by the respective selected transformed PRN bit sequence; and
   parity equation circuitry comprising logical operators for computing parity, the parity equation circuitry receiving the incoming bits and the selected transformed PRN bit sequence, wherein the parity equation circuitry is configured to route each incoming bit to the logical operator of the parity equation circuitry identified by the selected transformed PRN bit sequence, the logical operators operating on the bits routed thereto to compute parity bits, the parity equation circuitry outputting the incoming bits interleaved with parity bits.

2. The pseudo-random bit interleaver of claim 1, wherein the PRN generation source comprises a linear feedback shift register.

3. The pseudo-random bit interleaver of claim 1, wherein the PRN generation source comprises a state machine.

4. The pseudo-random bit interleaver of claim 1, wherein the PRN generation source comprises a memory device.

5. The pseudo-random bit interleaver of claim 1, wherein the interleaver is formed in an integrated circuit (IC).

6. The pseudo-random bit interleaver of claim 5, wherein the transformation circuitry comprises conductive traces formed in the IC such that each PRN bit sequence generated by the PRN generation source is reordered into a respective one of the transformed sequences of bits.

7. The pseudo-random bit interleaver of claim 5, wherein the transformation circuitry comprises matrix multiplication circuitry configured to multiply each PRN generated by the PRN generation source by a plurality of different nonsingular binary matrices.

8. The pseudo-random bit interleaver of claim 1, wherein the parity equation logical operators exclusive OR the incoming bits together that have been assigned thereto.

9. A method for pseudo-randomly interleaving incoming bits with parity bits, the method comprising:
   generating pseudo-random numbers (PRNs) with a pseudo-random number (PRN) generation source; each PRN comprising a sequence; and
   transforming each PRN bit sequence generated by the PRN generation source into a plurality of different transformed PRN bit sequences, wherein each of said plurality of different transformed PRN bit sequences identifies a respective parity equation logical operator to which a respective one of the incoming bits is assigned;
   selecting respective ones of the transformed PRN bit sequences and causing each respective incoming bit to be assigned to the parity equation logical operator identified by the respective selected transformed PRN bit sequence; and
   In the logical operators identified by the transformed PRN bit sequences, operating on the incoming bits to produce output bits comprising the incoming bits interleaved with parity bits.

10. The method of claim 9, wherein the PRN generation source comprises a linear feedback shift register.

11. The method of claim 9, wherein the PRN generation source comprises a state machine.

12. The method of claim 9, wherein the PRN generation source comprises a memory device.

13. The method of claim 9, wherein the method of interleaving is performed in an interleaver that is part of an encoder formed in an integrated circuit (IC).

14. The method of claim 13, wherein the transformation is performed by routing the bits of the PRN bit sequences generated by the PRN generation source along conductive traces formed in the IC such that each PRN bit sequence is reordered to produce a respective one of the transformed PRN bit sequences.

15. The method of claim 13, wherein the transformation is performed by matrix multiplication circuitry formed in the IC that multiplies each PRN bit sequence generated by the PRN generation source by a plurality of different nonsingular binary matrices to transform each PRN bit sequence generated by the PRN generation source into a respective one of said plurality of different transformed PRN bit sequences.

16. The method of claim 9, wherein the parity equation logical operators exclusive OR the incoming bits together that are assigned thereto.

17. A pseudo-random bit de-interleaver that receives incoming bits and de-interleaves the incoming bits, the incoming bits comprising information bits interleaved with parity bits, the de-interleaver separating the information bits from the parity bits, the de-interleaver comprising:
   a pseudo-random number (PRN) generation source for generating pseudo-random numbers (PRNs), each PRN comprising a sequence of bits;
   transformation circuitry configured to transform each PRN generated by the PRN generation source into a plurality of different PRNs, each of said plurality of different PRNs comprising a respective transformed sequence of bits, wherein each respective transformed sequence of bits identifies a respective parity equation to which a respective one of the incoming bits is assigned;
   selection circuitry configured to select respective ones of the transformed PRN sequences of bits and to cause each respective incoming bit to be assigned to the respective parity equation identified by the respective selected transformed sequence of bits; and
   parity equation logic circuitry comprising logical operators for computing parity, the parity equation circuitry receiving the incoming bits and the selected transformed PRN bit sequence, wherein the parity equation circuitry is configured to route each respective incoming bit to the logical operators of the parity equation circuitry identified by the respective selected transformed PRN bit sequence, the logical operators operating on the bits routed thereto to produce output bits comprising the incoming bits de-interleaved from the parity bits.

18. The pseudo-random bit de-interleaver of claim 17, wherein the PRN generation source comprises a linear feedback shift register.

19. The pseudo-random bit de-interleaver of claim 17, wherein the PRN generation source comprises a state machine.

20. The pseudo-random bit de-interleaver of claim 17, wherein the PRN generation source comprises a memory device.

21. The pseudo-random bit de-interleaver of claim 17, wherein the interleaver is formed in an integrated circuit (IC).

22. The pseudo-random bit de-interleaver of claim 21, wherein the transformation circuitry comprises conductive traces formed in the IC such that each PRN bit sequence generated by the PRN generation source is reordered into a respective one of the transformed sequences of bits.

23. The pseudo-random bit de-interleaver of claim 21, wherein the transformation circuitry comprises matrix multiplication circuitry configured to multiply each PRN generated by the PRN generation source by a plurality of different nonsingular binary matrices.

24. A method for pseudo-randomly de-interleaving incoming bits comprising data bits and parity bits, the method comprising:

Generating pseudo-random numbers (PRNs) with a pseudo-random number (PRN) generation source, each PRN comprising a sequence; and Transforming each pseudo-random number generated by the PRN generation source into a plurality of different transformed PRN sequences of bits, wherein each respective transformed PRN sequence of bits identifies a respective parity equation logical operator to which a respective one of the incoming bits is assigned;

Selecting respective ones of the transformed PRN sequences of bits and causing each respective incoming bit to be assigned to the parity equation logical operator identified by the respective selected transformed PRN sequence of bits; and In the logical operators identified by the transformed PRN bit sequences, operating on the incoming bits assigned thereto to produce output bits comprising the incoming bits de-interleaved from parity bits.

25. The method of claim 24, wherein the PRN generation source comprises a linear feedback shift register.

26. The method of claim 24, wherein the PRN generation source comprises a state machine.

27. The method of claim 24, wherein the PRN generation source comprises a memory device.

28. The method of claim 24, wherein the method of de-interleaving is performed in a de-interleaver that is formed in an integrated circuit (IC).

29. The method of claim 24, wherein the transformation is performed by routing the bits of the PRN bit sequences generated by the PRN generation source along conductive traces formed in the IC such that each PRN bit sequence is reordered to produce a respective one of the transformed PRN sequences of bits.

30. The method of claim 24, wherein the transformation is performed by matrix multiplication circuitry formed in the IC that multiplies each bit sequence generated by the PRN generation source by a plurality of different nonsingular binary matrices to transform each PRN bit sequence generated by the PRN generation source into a respective one of said plurality of different transformed PRN bit sequences.

31. The method of claim 24, wherein the parity equation logical operators exclusive OR the incoming bits together that have been assigned thereto.

\* \* \* \* \*